United States Patent [19]

Giniewicz et al.

[11] Patent Number: 4,977,547

[45] Date of Patent: Dec. 11, 1990

[54] METHOD OF DETECTING SOUND IN WATER USING PIEZOELECTRIC-POLYMER COMPOSITES WITH 0-3 CONNECTIVITY

[75] Inventors: Jayne R. Giniewicz; Robert E. Newnham; Leslie E. Cross, all of State College, Pa.; Ahmad Safari, Dayton, N.J.

[73] Assignee: Hoechst Celanese Corp., Somerville, N.J.

[21] Appl. No.: 271,579

[22] Filed: Nov. 15, 1988

Related U.S. Application Data

[62] Division of Ser. No. 742,334, Jun. 7, 1985, abandoned.

[51] Int. Cl.$^5$ ............................................. H04R 17/00
[52] U.S. Cl. .................................... 367/157; 310/337; 252/62.9
[58] Field of Search .................. 29/25.35, 594, 595; 310/334, 337, 357, 358, 800; 367/140, 157, 160, 161, 162, 164, 165, 167; 252/62.9

[56] References Cited

U.S. PATENT DOCUMENTS 4,624,796 11/1986 Giniewicz et al. .............. 501/134 X

FOREIGN PATENT DOCUMENTS 0247734 12/1987 European Pat. Off. ............ 310/358
2922260 8/1980 Fed. Rep. of Germany .
0105799 8/1979 Japan .................................. 310/800
0120900 9/1979 Japan .................................. 310/800

OTHER PUBLICATIONS

IEEE 1984 Ultrasonics Symposium, vol. 1, Nov. 14-16, 1984, X-Ray and Electrical Studies of the PbTiO$_3$-BiFeO$_3$ System, Soviet Physics-Crystallography, vol. 7, No. 1, Jul.-Aug. 1962.
American Ceramics Bulletin, New Horizons for Ceramics, vol. 63, No. 3, (1984).
Dielectric Properties of Solid Solutions of BiFeO$_3$ with PB(Ti$_1$Zr)O$_3$ at High Temperature and High Frequency, Robert T. Smith et al., Journal of Applied Physics, vol. 39, No. 1, Jan. 1968.

Primary Examiner—Brian S. Steinberger
Attorney, Agent, or Firm—Depaoli & O'Brien

[57] ABSTRACT

A hydrophone device is provided with a piezoelectric ceramic-polymer composite of 0-3 connectivity in which the piezoelectric filler comprises a solid solution of PBTiO$_3$-BiFeO$_3$ wherein the solid solution contains 50-80 wt. % of the BiFeO$_3$. The piezoelectric ceramic-polymer composite has large hydrostatic piezoelectric charge and voltage coefficients which are desirable in hydrophone devices.

7 Claims, 1 Drawing Sheet

METHOD OF DETECTING SOUND IN WATER USING PIEZOELECTRIC-POLYMER COMPOSITES WITH 0-3 CONNECTIVITY

This is a division of U.S. application Pat. No. 06/742,334, filed June 7, 1985 by Giniewicz et al., which is now U.S. Pat. No. 462,476, issued on Nov. 26, 1986.

BACKGROUND OF THE INVENTION

This invention is related to piezoelectric materials and, more particularly, to a 0-3 piezoelectric ceramic-polymer composite for hydrophone applications and the like.

Piezoelectricity can be explained as electric polarization produced by mechanical stress in certain substances. Piezoelectric materials, such as lead zirconate titanate (PZT), are used in a wide variety of applications. In hydrophone devices piezoelectric materials detect low frequency acoustic waves passively. Hydrophones are frequently made from single phase PZT. Large hydrostatic piezoelectric charge and voltage coefficients ($d_h$ and $g_h$) are desired in these devices. Thus, even though the magnitudes of the piezoelectric coefficients $d_{33}$ and $d_{31}$ of PZT are large, the hydrostatic coefficients $d_h$ and $g_h$ are small, because the $d_{33}$ and $2d_{31}$ coefficients are almost equal and opposite in sign, and also, the dielectric constant of PZT is large. The large difference of the acoustic impedance between PZT and water requires impedance matching layers for underwater hydrophone applications.

In order to improve and modify material properties for hydrophone devices, several different types of piezoelectric PZT-polymer composites have been recently investigated utilizing the concept of phase connectivity. It has been found that the electric flux pattern and the mechanical stress distribution together with the resulting physical and piezoelectric properties depend strongly on the manner in which the individual piezoelectric and polymer phases of the diphasic composites are interconnected. Each phase in a composite may be self-connected in zero, one, two, or three dimensions. Thus, a diphasic 2-1 connectivity pattern, for example, has one phase self-connected in two dimensional layers, the other in one dimensional chains or fibers. Below are represented some of the piezoelectric composites with connectivity patterns in which the piezoelectric phase appears first.

0-3 composites: PZT particles suspended in a polymer matrix 1-3 composites: PZT rods aligned in the poling direction held together by a polymer matrix 1-3-0 composites: PZT rods aligned in the poling direction held together by a foamed polymer matrix 3-1 and 3-2 composites: holes drilled in a prepoled PZT block, then the holes filled or covered by polymer.

3—3 composites: lost-wax method using coral as the starting material, or by a fugitive phase method (BURPS process).

The $d_h$, $g_h$ coefficients and $d_h g_h$ figure of merit of the diphasic composites are significantly improved over single phase PZT due to decoupling of the $d_{33}$ and $d_{31}$ coefficients and/or the reduction of the dielectric constant.

The piezoelectric ceramic-polymer composites of 1-3, 1-3-0, 3-1, 3-2, and 3-3 connectivities are often expensive and cumbersome to fabricate. The PZT-polymer 0-3 composite is relatively easy and inexpensive to make inasmuch as fabrication involves simply mixing the piezoelectric ceramic particles and polymer, shaping and curing.

However, piezoelectric ceramic powders which are prepared according to the usual methods such as those which are described in the following are accompanied by conspicuous difficulties. The usual piezoelectric ceramic powders are produced by grinding the piezoelectric ceramics prepared by solid-phase reaction such as ceramic materials containing titanium solid solutions of $BaTiO_3$, $PbTiO_3$, $PbZrO_3$-$PbTiO_3$, etc. or single crystals such as potassium-sodium-niobate (PSN), etc., using a ball mill, a vibratory mill, etc., and adjusting the resulting powder to a desired size distribution. Composites of these ground powders exhibit inferior piezoelectric properties than what may be expected when considering the piezoelectric nature of the filler materials alone. Moreover, this type of composite material is fragile and hardly lends itself to being shaped due to the lack of flexibility and molded articles made from it are heavy and costly. These disadvantages have led to the result that the point still has not been reached at which the use of compound materials of this type is practical for all intents and purposes.

Extensive research directed at determining the origin of the above-described deterioration of properties has led to the conclusion that structural fractures have appeared in the microcrystals during the comminuting (pulverizing) which is carried out after the solid-phase reaction or the preparing of the single crystals and these fractures lead to the forming of multidomains within the particle fragments. It is almost impossible to force the distorted phases to orient themselves in the same direction as those of the applied polarizing electric field even if the applied voltage is close to the maximum voltage which the composite material can withstand without undergoing dielectric collapse or arcing through. In addition, the electric field which can act effectively on the individual ceramic particles combined with the polymer substance is significantly decreased due to the combining process to a few tenths or a few hundredths of its strength if one takes into account the ratio of the dielectric constants of the polymeric substance to that of the ceramic substance. Therefore, the mixing of the ceramic powders or single crystals with polymeric substances cannot impart piezoelectric properties to the resulting composite materials, to any noteworthy degree.

One attempt to solve the above mentioned disadvantages is disclosed in German Patent No. 2922260 wherein a process for preparing a piezoelectric ceramic powder which has virtually single domain microcrystals is formed. Thus, the piezoelectric ceramic powder is formed by heating the starting powders in a suitable atmosphere so as to undergo a reaction in the solid phase and then cooling the resulting reaction product as desired. The cooling stage is conducted quickly such as by quenching. What has been found is that the orientation in the direction of the applied electrical field is easily achieved with the microcrystals produced by quenching the solid phase because the piezoelectric crystals are not accompanied by structural fractures which cause the production of numerous multiple domains in the microcrystals as a result of stress resulting from the typical pulverizing. Consequently the piezoelectric ceramic powders are able to demonstrate especially high ferroelectric and piezoelectric properties.

Among the many types of ferroelectric materials disclosed by this patent, lead titanate and solid solutions containing lead titanate as the main component, for example, PbTiO$_3$-BiFeO$_3$ are disclosed.

SUMMARY OF THE INVENTION

In accordance with the present invention a piezoelectric ceramic-polymer composite of 0-3 connectivity is prepared having improved piezoelectric efficiency by utilizing a quenched PbTiO$_3$-BiFeO$_3$ powder as the piezoelectric ceramic filler.

Very thin sheets of the composite of this invention are possible due to the fine particle size obtained by quenching the filler powders. The high strain in this particular system allows the production of small particles on quenching with minimal damage to individual crystallites. Sheets made with single crystallites created in this way are more easily poled and have an enhanced piezoelectric sensitivity over 0-3 composites made with fine powders produced by grinding.

PbTiO$_3$-BiFeO$_3$ solid solutions exhibit considerable piezoelectric anisotropy especially at the tetragonal/rhombohedral phase boundary making composites having a piezoelectric filler of composition in this range highly sensitive to hydrostatic pressure. 0-3 composites incorporating this filler are therefore far more responsive than 0-3 designs currently produced containing PbTiO$_3$ and PZT fillers.

DESCRIPTION OF THE PREFERRED EMBODIMENTS

In accordance with the present invention, piezoelectric ceramic-polymer composite of 0-3 connectivities are fabricated in which the piezoelectric ceramic filler is a quenched (Pb,Bi) (Ti,Fe)O$_3$ powder whose particles are dispersed in a 3-dimensionally connected polymer phase.

Figure 1:
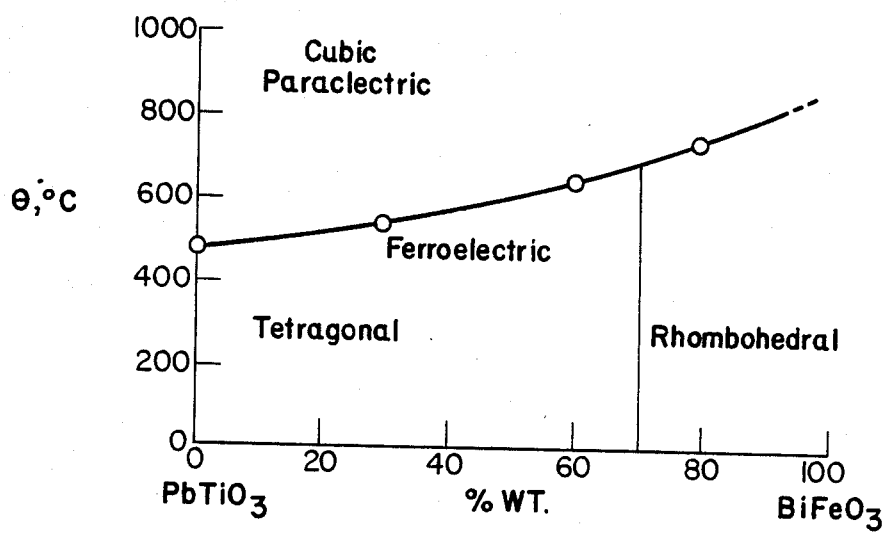
FIG. 1 is a phase diagram of the PbTiO$_3$-BiFeO$_3$ solid solution.

Filler powders for the 0-3 composites are synthesized from the system PbTiO$_3$-BiFeO$_3$ for which there is a continuous solid solution of the end numbers across the entire composition range (FIG. 1). The solid solution of the powders comprise 50-80% by weight BiFeO$_3$, which compositions are in the vicinity of the tetragonal/rhombohedral phase boundary of the solid solution.

The piezoelectric powder is formed by preparing batches from the oxides: PbO, TiO$_2$, Bi$_2$O$_3$, and Fe$_2$O$_3$, and weighing the oxides in appropriate proportions allowing for the weight loss and purity characteristics of the starting materials. The weighed oxides are then mixed and ball milled with zirconia media for 12 hours and dried 8-12 hours in a low temperature furnace. Finally, the green mixture is milled in a spex mill for 10 minutes to break up agglomerates and further homogenize the batch. The green powders are subjected to a low temperature (700° C.-800° C.) primary calcination for 1.5 hours. The calcined powders are ground, sieved, and loosely compacted. The pellets are then subjected to a second high temperature firing (950° C.-1050° C.) from which they are quenched. The pellets are quenched from the second firing to room temperature either in air or in water. Soft agglomerates are broken by light grinding and the quenched powder sieved through a fine mesh. Quenching produces an average particle size of 5 μm.

The polymers which can be used as the matrix include polystyrene, polysulfone, polycarbonate, polypropylene, polyethylene, polyethylene terephthalate, polyphenylene oxide, polyurethane elastomer, polyvinyl carbazole and polyvinylidene fluoride, polyacrylate esters, polymethacrylate esters, polyvinyl chloride, polyvinylidenes, polymers of acrylonitrile, polymers of methacrylonitrile, polyvinyl acetate, polyvinyl pyrrolidone, cellulose type polymers such as ethyl cellulose, soluble polymers of polyimide, epoxy resins, curable polymers such as unsaturated polyester resins can be used as wells as natural and synthetic rubber including fluororubber and chloroprene. The mixtures of the aforementioned polymers and the copolymers of aforementioned polymers can be used.

0-3 Composite materials are diphasic materials in which the ceramic particles are not in contact with each other and the polymer phase is self-connected in all three dimensions. The ceramic particle used in this invention is the quenched (Pb,Bi)(Ti,Fe)O$_3$ powder whose particles are dispersed in a 3-dimensionally connected polymer phase. Loading of the ceramic powder in the polymer matrix ranges from 50-75 volume percent preferably 60-75 volume percent.

The quenched filler material is mixed with the polymer phase and (when necessary) the mixture is placed in a vacuum for 0.5 hour to eliminate any air introduced during the mixing process.

The methods of forming the piezoelectric ceramic-polymer composites are discussed below:

Hot Rolling:

The ceramic-polymer mixture is calendered at 40° C. The calendered material is then cured under pressure applied according to the volume percent of filler material.

Molding

The mixture is placed in a mold on which a low pressure is applied. The composite is cured in the mold with the applied pressure maintained for the entire cure period.

Die Pressing

The composite material is set between two sheets of non-adhering material and placed in a suitably lined die. The material is then hot-pressed under a pressure applied according to the volume percent of ceramic. Composites containing 50-60 volume percent ceramic are hot-pressed for only 5-15 minutes and cured without pressure. Those composites containing 65-75 volume percent ceramic are subject to the applied pressure for the entire cure period.

EXAMPLE

Figure 2:
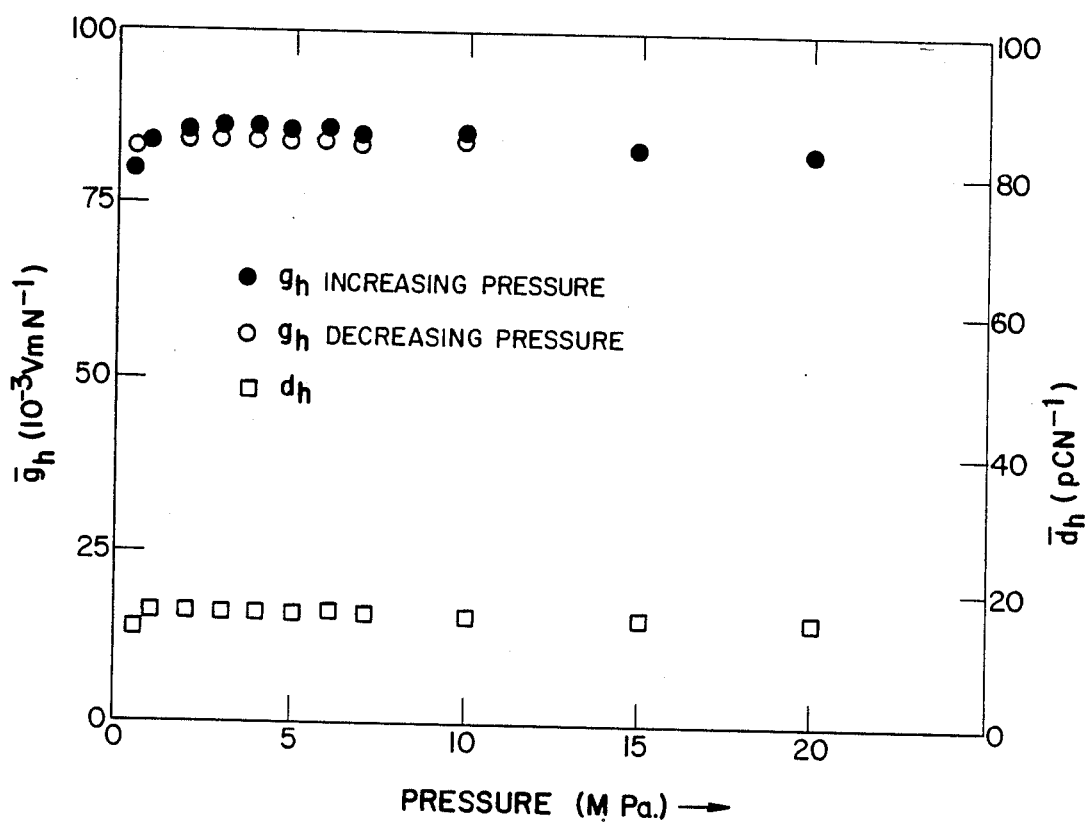
FIG. 2 is plot of the hydrostatic coefficient d$_h$ and g$_h$ relative to increasing pressure.

The 0-3 composites produced are strong but flexible and, due to the fine particle size obtained, very thin. Successful poling is achieved with relative ease and minimal breakdown. The poled composites exhibit outstanding hydrostatic sensitivity attaining values of d$_h$ and g$_h$ well in excess of the values reported for PbTiO$_3$ and PZT as a 0-3 composite filler. Composites containing 60 volume percent (Pb$_{0.5}$,Bi$_{0.5}$)(Ti$_{0.5}$.Fe$_{0.5}$)O$_3$ exhibit a d$_h$ of 22 pC/N, g$_h$ of 85×10$^{-3}$Vm/N and Figure of merit d$_h$g$_h$ of 1800×10 m /N. These values for the piezoelectric coefficients and the value for the dielectric constant (30) remain virtually constant over a broad pressure range (FIG. 2). The measurement of the $g_h$ of the composite is basically a comparative technique in which a piezoelectric ceramic with a known $g_h$ (PZT 501) is used as a standard. In this method the sample and the standard are subjected to the same hydrostatic pressure within an oil-filled chamber. The voltage produced by the sample and the standard is displayed on a spectrum analyzer. This is repeated at different applied static pressure, and the voltage produced is noted. The $g_h$ is calculated by measuring the voltage responses, capacitances, and dimensions of the sample and the standard. The $d_h$ coefficient of the sample is calculated from the equation $d_h = g_h \epsilon_0 K_{33}$ where $\epsilon_0$ is the permittivity of free space ($8.854 \times 10^{-12}$ F/m) and $K_{33}$ is the dielectric constant of the sample. The figure of merit increases as the volume of ceramic in the composite is increased.

What is claimed:

1. A method of detecting acoustic waves in water comprising: using an underwater hydrophone device containing a piezoelectric-polymer composite of 0-3 connectivity, said composite comprising a matrix of insulating polymer and a piezoelectric ceramic powder dispersed within said polymer matrix, said ceramic powder comprising a $PbTiO_3$-$BiFeO_3$ solid solution containing 50-80% by weight of $BiFeO_3$.

2. The method of claim 1 wherein said ceramic powder has been formed by quenching a solid solution of heated $PbTiO_3$ and $BiFeO_3$.

3. The method of claim 2 wherein said quenching is done in water.

4. The method of claim 2 wherein said quenching is accomplished in air.

5. The method of claim 1 wherein said ceramic powder comprises 50-75 volume percent of said composite.

6. The method of claim 5 wherein said ceramic comprises 60-75 volume percent of said composite.

7. The method of claim 1 wherein said ceramic powder has an average particle size of about 5 microns.

* * * * *